United States Patent [19]
Shindley et al.

[11] Patent Number: 5,339,074
[45] Date of Patent: Aug. 16, 1994

[54] VERY LOW FREQUENCY TRACKING SYSTEM

[75] Inventors: Richard P. Shindley; Randall S. Williams, both of Chaska, Minn.

[73] Assignee: Fluoroware, Inc., Chaska, Minn.

[21] Appl. No.: 759,538

[22] Filed: Sep. 13, 1991

[51] Int. Cl.$^5$ .............................................. H04B 5/00
[52] U.S. Cl. .......................... 340/825.31; 340/825.34; 340/825.54; 340/825.72; 340/539; 455/41
[58] Field of Search .................. 340/825.34, 825.31, 340/825.54, 572, 573, 679, 555, 539, 870.31, 870.28, 870.29, 825.69, 825.72; 235/380, 382, 492, 451; 455/41, 66

[56] References Cited
U.S. PATENT DOCUMENTS

| | | | |
|---|---|---|---|
| 3,891,980 | 6/1975 | Lewis et al. | 340/825.31 |
| 4,189,712 | 2/1980 | Lemelson | 340/825.31 |
| 4,354,189 | 10/1982 | Lemelson | 340/825.31 |
| 4,384,288 | 5/1983 | Walton | 340/825.34 |
| 4,712,103 | 12/1987 | Gotanda | 235/382 |
| 4,818,973 | 4/1989 | Yamakawa et al. | 340/572 |
| 5,019,815 | 5/1991 | Lemelson et al. | 340/825.54 |

OTHER PUBLICATIONS

Spec Sheet, Telsor Corporation Antenna Models 5100, 5110, 5120 and 5130, Dated Mar. 1991.
Spec Sheet, Telsor Corporation Transponder Models 1781, 1783, 1787, 1789 and 1791, Dated Sep. 1991.
Spec Sheet, Telsor Corporation Programmer, Models 3010, and 3020 Dated Mar. 1991.
Spec Sheet, Telsor Corporation Sensor, Models 1840, 1845, 1880 and 1885, Dated Mar. 1991.
Spec. Sheet, Telsor Corporation Reader Interface Models 2002 and 2022, Dated Mar. 1991.

*Primary Examiner*—John K. Peng
*Assistant Examiner*—Andrew Hill
*Attorney, Agent, or Firm*—Palmatier, Sjoquist & Helget

[57] ABSTRACT

Apparatus identifying an instrumentality such as a person's hand or an article of merchandise, wherein the instrumentality carries a tag incorporating a transponder generating and transmitting a radio frequency identification signal in response to a radio frequency transmitted inquiry, a nest comprising an identifying station and incorporating a proximity sensor sensing the presence of the instrumentality at the identifying station and producing an indication of the presence or absence of the instrumentality, the identifying station comprising a radio frequency sensor portion generating a radio frequency transmitted inquiry transmitted to the transponder in response to sensing the presence of the instrumentality and receiving the radio frequency identification signal from the transponder, the proximity sensor terminating generation of the radio frequency transmitted inquiry when a clear and reliable output indication identifying the tag has been produced, and the proximity sensor also preventing, after producing a clear and reliable output indication, generation of a subsequent radio frequency transmitted inquiry until the proximity sensor has subsequently produced indications of the absence of the instrumentality at the identifying station.

5 Claims, 6 Drawing Sheets

VERY LOW FREQUENCY TRACKING SYSTEM

BACKGROUND OF THE INVENTION

In industrial processes, it is often important to be able to accurately identify an event such as a person commencing to operate a personal computer or a computer terminal, or such as an item of material or a container residing at a particular location. Such an identification may be recorded and may initiate other events or sequences, and may initiate gathering of other information, such as the time and location of the event or such as the nature of the events to follow.

Identification tags on such an instrumentality (a person, object or container), have been previously known to incorporate a transponder and to emit a radio frequency (hereafter r.f.) signal in response to an r.f. transmitted inquiry, to identify the tag.

However, extensive uses of r.f. transmissions raise concerns with respect to unintended effects of such r.f. signals and responses.

Some of the r.f. transmissions may be closely coupled with personnel in confined locations. It is believed that such r.f. transmissions may have some adverse effects upon such personnel.

SUMMARY OF THE INVENTION

An object of the invention is to provide a new and improved device for identifying an instrumentality, such as a person or an object, through the use of r.f. signal transmitting and receiving devices coupled together while minimizing possible adverse effects of such r.f. transmissions on nearby persons and nearby environment.

A feature of the invention is the provision of the method and means for identifying a person who assumes a position for operating an apparatus, such as the trackball, at a computer terminal. A tag incorporating a programmed transponder is attached to the person's wrist and will transmit an identifying unique r.f. signal in response to an r.f. transmitted inquiry from a computer-controlled identifying station incorporated into a portion of such apparatus, such as a nest for the trackball.

An advantage of identifying a person in the manner set forth is that the person may conveniently wear a wristband incorporating such a tag without interfering with other normal activities of the person. The resulting identification may be simply recorded or may be used to permit or cause the computer to perform certain functions without operating a keyboard or other facility.

Another feature of the invention is the provision of a proximity sensor at an identifying station to sense the presence of an instrumentality, i.e., a person or object carrying a tag with a programmed transponder, in a position to be identified. In addition, the identifying station incorporates a computer chip and r.f. sensor which is programmed to limit the length of the r.f. transmissions to obtain the identification of the instrumentality, and to also prevent additional transmissions after the instrumentality has been identified.

In obtaining the identification of such an instrumentality, the identifying station is polled sequentially, along with other identifying stations, by a host computer for a report. The identifying station responds to the polling inquiry, and to an indication from the proximity sensor that the instrumentality is present, by first initiating a momentary transmitted inquiry, to which the transponder of the tag produces an identifying response. The identifying station immediately reports to the host computer the identity of the tag on the instrumentality; and at the same time, the identifying station sets a one-time flag that the tag identity has been read and reported. Subsequently, when the identifying station is again polled, the proximity sensor again indicates the presence of the instrumentality, but the identifying station recognizes the one-time flag and simply reports that instrumentality is still sensed to be present, but that its identity has already been read and reported.

When the instrumentality has been removed from the identifying station, the proximity sensor, after a short delay, will permit the one-time flag to be cleared and permit the identifying station to be ready to again receive another instrumentality to be identified. The short delay permits the instrumentality previously identified to be briefly removed from the identifying station and then returned again without permitting the identifying station to generate and transmit an r.f. inquiry.

A principal advantage of limiting the r.f. transmitted inquiry to only those occasions when an instrumentality is present, is to minimize the existence of r.f. fields around operating personnel and equipment that may be sensitive to such r.f. fields. Similarly, the advantage of limiting the repeating of such r.f. transmissions is to minimize the possible hazards of such excessive r.f. transmissions. In addition, polling of the several stations is not slowed by excessive identifying activity at each station.

Of course, the amount of r.f. transmissions is thereby minimized; and where there is no instrumentality to be identified, there is no delay created in polling the various ones of multiple identifying stations.

Still another feature is in the particular proximity sensors utilized. One or more photodiodes sense the physical presence of the instrumentality. In one form, the instrumentality obstructs transmission of ambient light to the photodiode, which indicates a change in its circuit. No moving parts are utilized in this form. This form of proximity sensor is particularly useful in detecting the presence of a person's hand or arm.

A principal advantage in the use of photodiodes is the prevention of generating any particles which are contaminants in the processing of silicon wafers.

Another principal advantage in the use of photodiodes to sense the presence of the instrumentality is that no additional activity by a person is needed to induce the identifying functions. There are no buttons to operate and no other physical activity needed. The intended reading of the identification tag with the transponder is not affected. In some instances, a mechanical feeler may be operated by an object at the identifying station, but the feeler, which operates with a minimum of physical force, minimizes the generation of particles.

An additional feature of the invention is a supporting nest upon which a portion of the instrumentality, such as a person's arm, may rest as the expected function is being performed. The presence of the person's arm may be detected so that the identity of its identifying tag may be determined. The nest will hold the instrument in a certain position so that the person's hand and arm are required to have a particular location and orientation.

Such a supporting nest provides the advantage of establishing a positive position between the identifying tag which incorporates the transponder, and the r.f. antenna which is a part of the identifying station.

A further feature of the invention is the provision of an LCD display on the nest for the box which may be programmed to display a message relevant to the contents of the box. For instance, the silicon wafers in the box may be at an intermediate stage of processing and the message may indicate the required next destination or station for further processing.

Still another feature is the ornamental design of the nest for the trackball device, and of the nest for the box.

DETAILED SPECIFICATION

Figure 1:
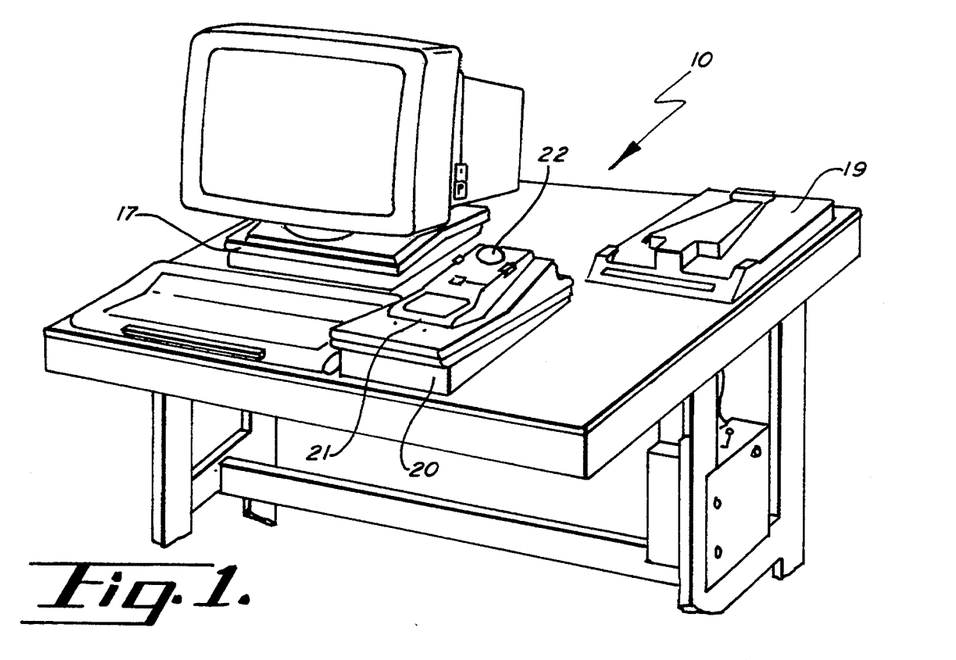
FIG. 1 is a perspective view of the identifying stations and the computer terminal.
Figures 4, 5:
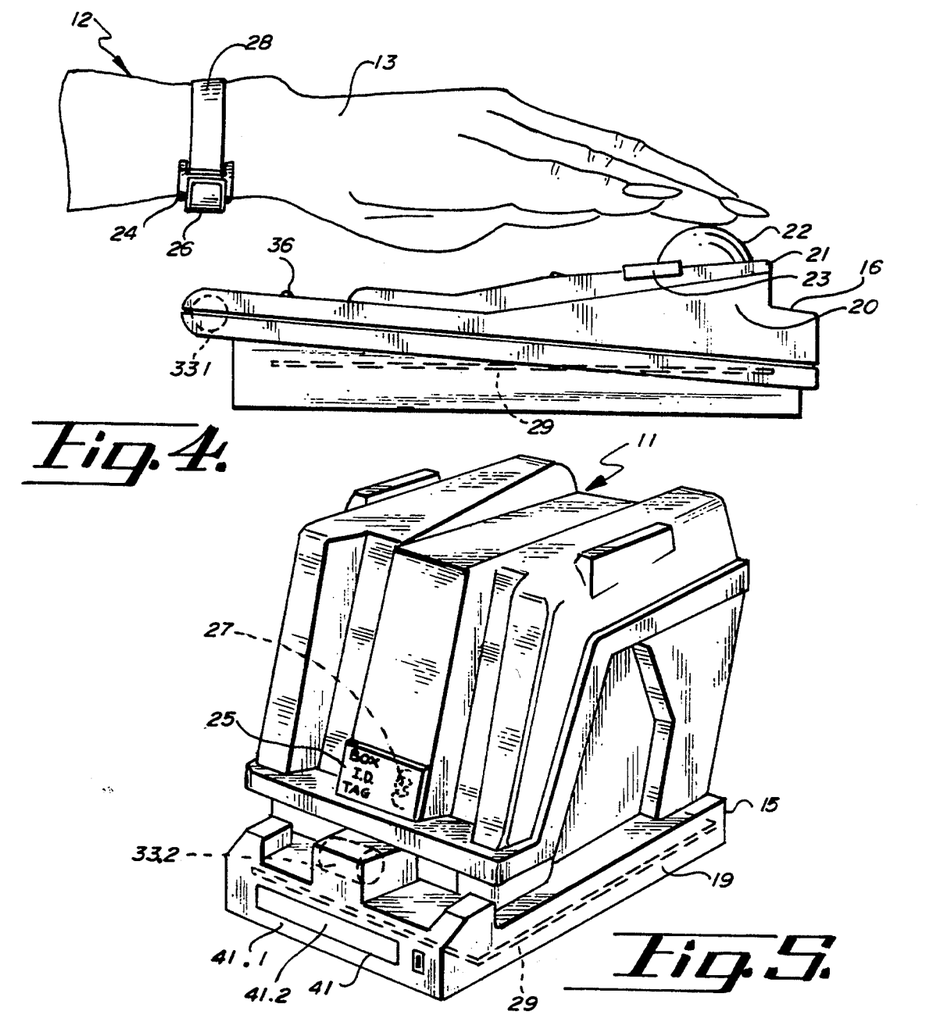
FIG. 4 is an elevation view of a trackball nest showing it in use.
FIG. 5 is a perspective view of a typical box being identified and its nest.

The tracking system of the present invention is indicated in general in FIG. 1 by the numeral 10, and is capable of identifying an instrumentality which may be in the form of a container or box 11 for storing or shipping silicon wafers contained in a wafer carrier as illustrated in FIG. 5; or the instrumentality may comprise a person 12 whose hand 13 is illustrated in FIG. 4. With reference to such a container or box 11 of FIG. 5, such a box may be one of many boxes containing silicon wafers at various stages of processing and being stored between process steps. Of course, it is important to keep track of such boxes so that they may be efficiently handled and moved through the processing system during the manufacture of chips from the wafers being stored in the containers.

The person 12 may be identified as the person assumes a position to work at a workstation, and the identification of the person may be used for various purposes, such as to boot-up a computer or to allow access into certain software programs, etc.

Figure 11:
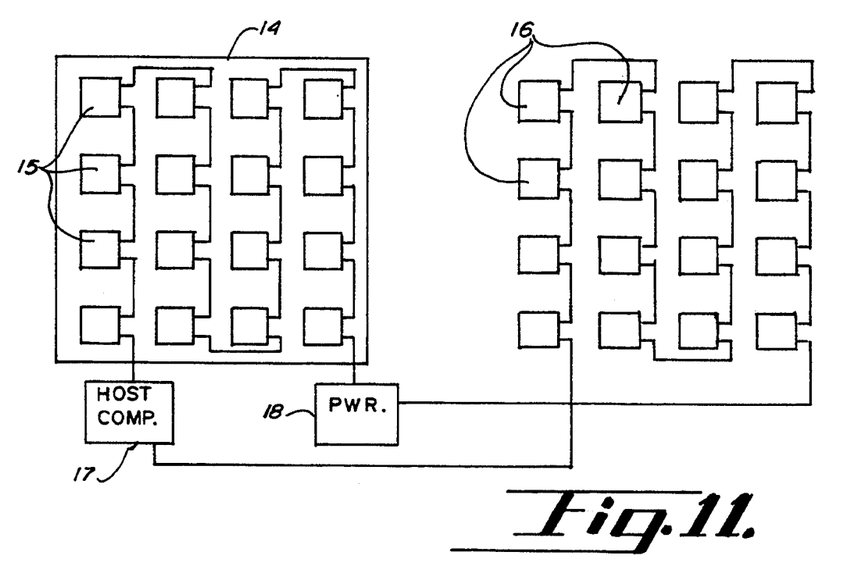
FIG. 11 is a block diagram showing multiple identifying stations for various instrumentalities, being polled by a host computer.

The containers or boxes 11 which contain wafers being processed would ordinarily be stored in a clean room 14 illustrated diagrammatically in FIG. 11 wherein a multiplicity of identifying stations 15 are available for identifying such containers or other vehicles related to the processing of wafers. Similarly, a plurality of identifying stations 16 are available for identifying persons at their various workstations.

The identifying stations 15, 16, are under the control of a host computer 17 which regularly and repeatedly polls each of the identifying stations 15, 16 seeking a response to determine the presence and identity of an instrumentality at such an identifying station. Of course, a power supply 18 is also provided, also connected to each of the identifying stations, 15, 16 to supply the necessary DC power to these stations.

Although the identifying stations could take a number of different forms, the identifying stations 15 are illustrated in the form of a nest 19 upon which the container 11 may rest in a predetermined and specified position so that its presence may be sensed. The identifying stations 16 may also take a number of different forms, but in the form illustrated, the identifying stations 16 take the form of a trackball nest 20 to carry a trackball device or control 21 in such a position that the person 12 must orient the operating hand 13 in a predetermined relation to the nest 20 in order to operate the trackball device 21.

It will be recalled that a trackball may control a computer in a manner similar to a "mouse", except that the trackball device has the control ball 22 in a stationary but upright position so that it can be turned by the fingers of the person's hand; and the trackball device also has additional controls such as a pressure operated button 23 to provide additional control functions for the computer or terminal.

Each of the instrumentalities 12, 11, carries an identifying tag 24, 25, each of which confines a programmed transponder 26, 27 which incorporates an r.f. antenna and which generates a unique r.f. identifying signal in response to an r.f. transmitted inquiry from a remote location outside of the respective tag 24, 25.

It will be recognized that the tag 24 is carried by a strap 28 on the person's wrist; and the tag 25 is adhered directly to the side of the box 11.

Figure 12:
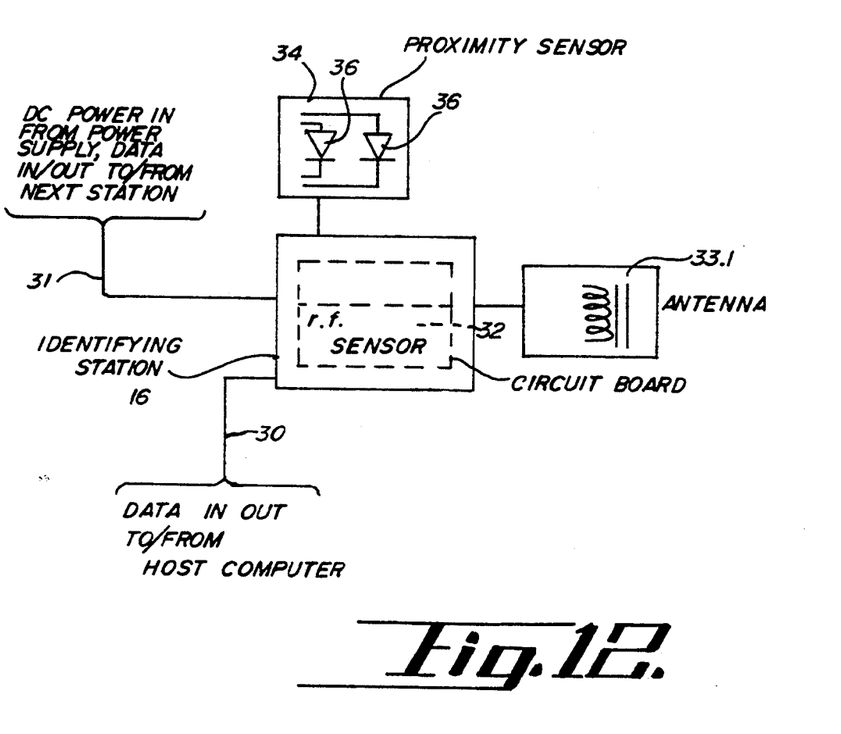
FIG. 12 is a diagrammatic sketch showing the relation of the major components of the instrumentality identifying station to the circuit board contained in a nest for a trackball.
Figure 14:
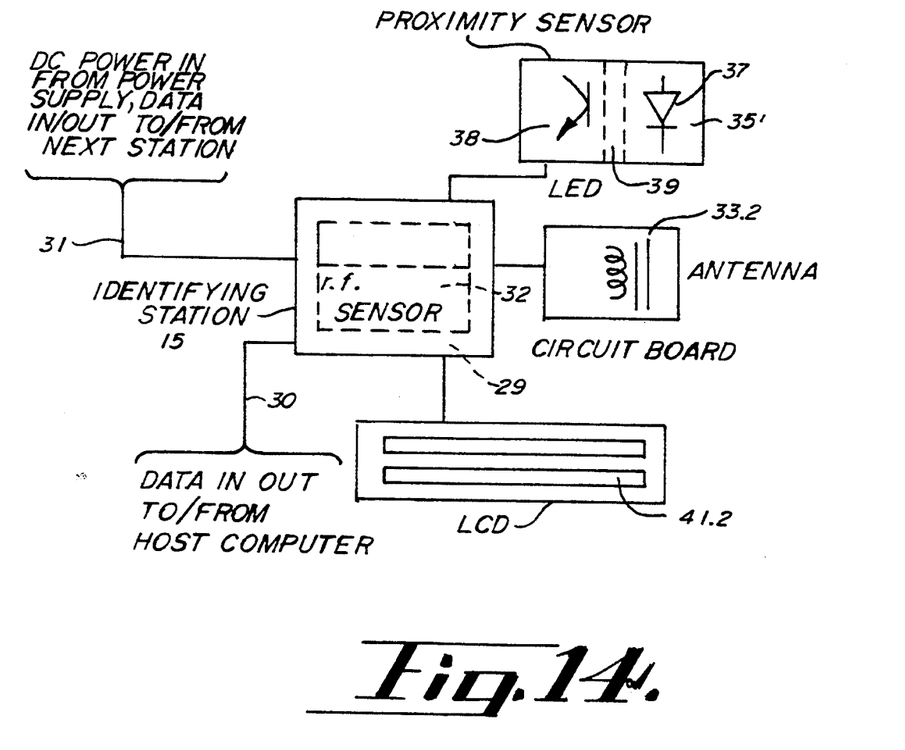
FIG. 14 is a diagrammatic sketch showing the relation of the major components of the instrumentality identifying station to the circuit board contained in a nest for a box.

As shown in FIGS. 12 and 14, both of the identifying stations 15, 16 are substantially identical to each other with certain minor exceptions, as will be noted. Each of the identifying stations has a circuit board 29 contained within the respective housing or nest, 19, 20; and the circuit board has a pair of cable connections 30 and 31 connecting it to the circuit board of the next adjacent identifying station and to the host computer 17 and the power supply 18. The cable connection 30 transmits data in and out, to and from the host computer; and the cable connection 31 transmits power from the power supply 18 to the circuit board 29 and also transmits data in and out, and to and from the next identifying station. In this way, all of the identifying stations are essentially series connected with the host computer and with the power supply, substantially as illustrated in FIG. 11.

Each of the circuit boards also includes an r.f. sensor 32 performing multiple functions as hereafter described, and is importantly connected to the antenna 33.1, 33.2. In the trackball nest 20 of identifying station 16, the respective antenna is indicated by the numeral 33.1; and in the container nest 19 of identifying station 15, the respective antenna is identified by the numeral 33.2. Both of the antennas 33.1 and 33.2 are physically located in their respective nest at a position closely adjacent the location of the respective tag 24, 25 of the instrumentality being identified.

Each of the identifying stations 15, 16 has a proximity sensor 35 or 34, wherein the proximity sensor 34 is utilized in the identifying station 16 for identifying the person 12; and the proximity sensor 35 is utilized in the identifying station 15 in nest 19 in relation to the container or box 11 being identified therein.

The proximity sensor 34 of identifying station 16 embodies a pair of photodiodes 36 on the upper surface of the housing or nest 20 so that the person's wrist or hand 13 will obstruct or interfere with ambient light reaching the photodiodes 36 when the person's hand 13 is in position to operate the trackball device 21. In this way, the proximity sensor 34 will sense the presence of the person 12 at the trackball station. The proximity sensor 34 is connected, in the identifying station 16, to the respective circuit board 29 and the r.f. sensor 32 thereof. Whereas one of the functions of the r.f. sensor is to generate an r.f. signal to be transmitted by the antenna 33.1, the proximity sensor 34 will prevent the r.f. sensor from generating the r.f. signal when the proximity sensor 34 senses the absence of the instrumentality or person's wrist 13 at the identifying station.

The proximity sensor 35, utilized in conjunction with the identifying station 15 and in the nest 19, also utilizes a photodiode 37, but in the proximity sensor 35, the photodiode 37 is not exposed to ambient light, but is exposed to the light generated by an LED light source 38. The light from the LED is obstructed by a movable armature 39 within the proximity sensor 35 and movable by a box-engaging feeler or movable button 40 which is engaged by the surface of the container 11 when it is properly mounted and carried upon the nest 19. In the identifying station 15, the proximity sensor 35 is connected to the circuit board 29 and particularly to the r.f. sensor 32 thereof; and the proximity sensor 35 will alternately permit or prevent the r.f. sensor 32 from generating an r.f. signal to be transmitted by the antenna. When the feeler 40 is not engaged by a box 11, the box 11 is absent from the nest 19 and the armature 39 will permit transmission of light from the LED light source 38 to the photodiode 37; and in this condition, the proximity sensor 35, which is connected to the r.f. sensor 32, prevents the r.f. sensor from generating the r.f. signal to be transmitted by the antenna.

Alternately, when the feeler 40 is engaged by the box properly placed on the nest 19, the feeler 40 moves the armature 39 as to obstruct light from the LED light source 38, and the obstruction and reduced light is sensed by the photodiode 37 so that in this condition, the proximity sensor 35, which is connected to the r.f. sensor 32, permits the r.f. sensor to generate and transmit the r.f. signal to and by the antenna.

The nest 19, upon which the container 11 may lie, also has a window 41 in its front panel 41.1, through which a two-line LCD display 41.2 may be seen. The LCD 41.2 is also connected to the r.f. sensor 32 as shown in FIG. 14.

Figures 2, 3:
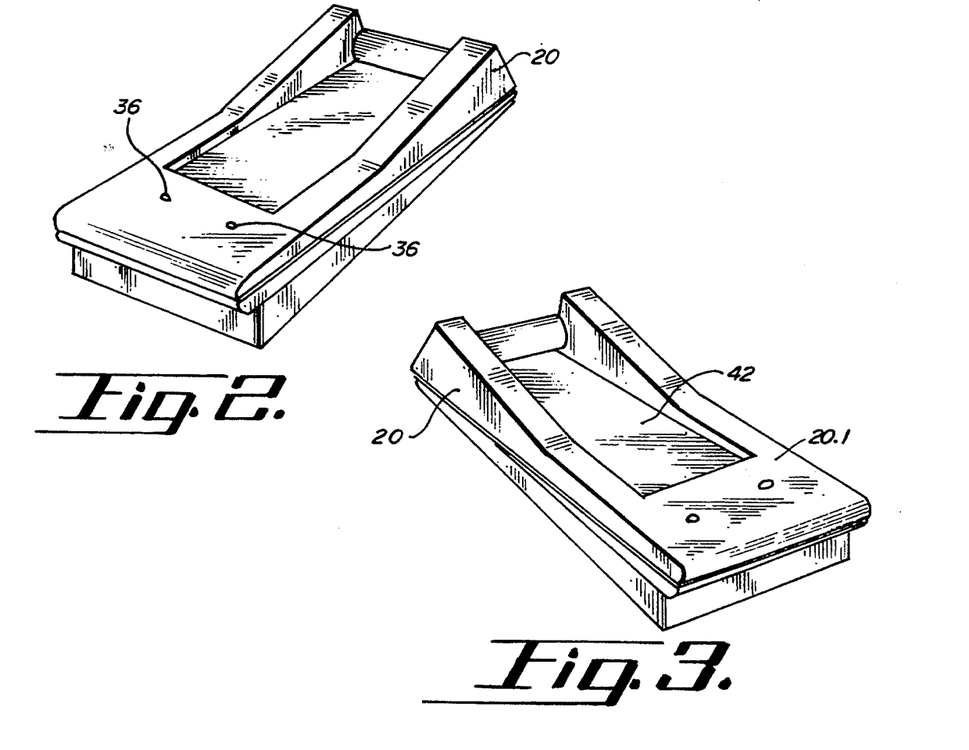
FIG. 2 is a right side perspective view of a trackball nest.
FIG. 3 is a left side perspective view of the nest for a trackball.

In FIGS. 2 and 3, the trackball nest is illustrated so that the ornamental design of it is apparent. The rectangular shape of recess 42 and the relative locations of the recess 42 and photodiodes 36 are utilitarian, and the balance of the aesthetic design is ornamental. The upper portion 20.1 of the housing has an elongate recess 42 therein to receive the trackball unit 21, and as will be apparent, the photodiodes 36 protrude through the upper portion of the housing to respond to ambient light above the trackball nest.

Figure 6:
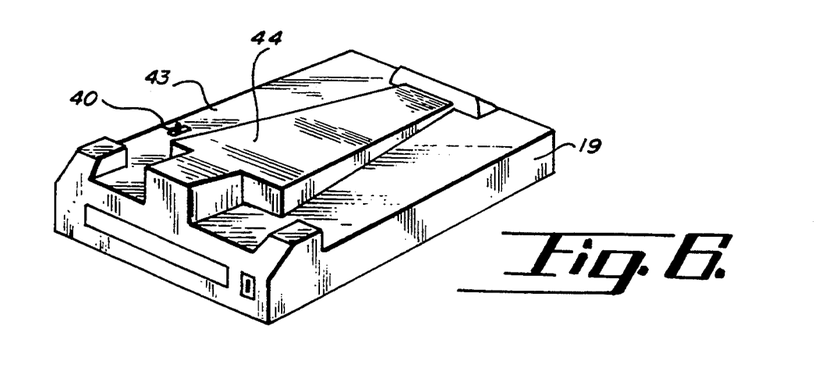
FIG. 6 is a right side perspective view of a nest for a box.
Figure 7:
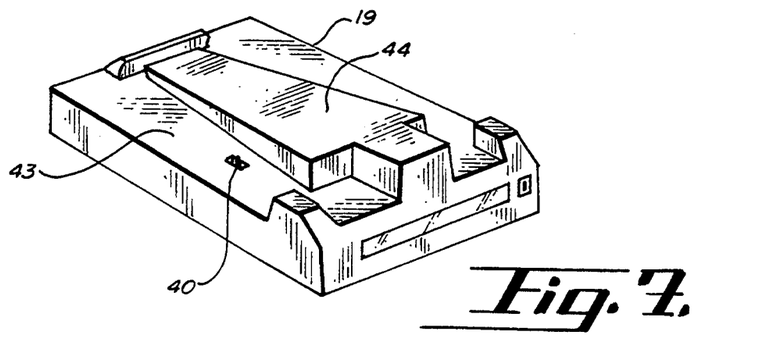
FIG. 7 is a left side perspective view of a nest for a box.
Figures 8, 9, 10:
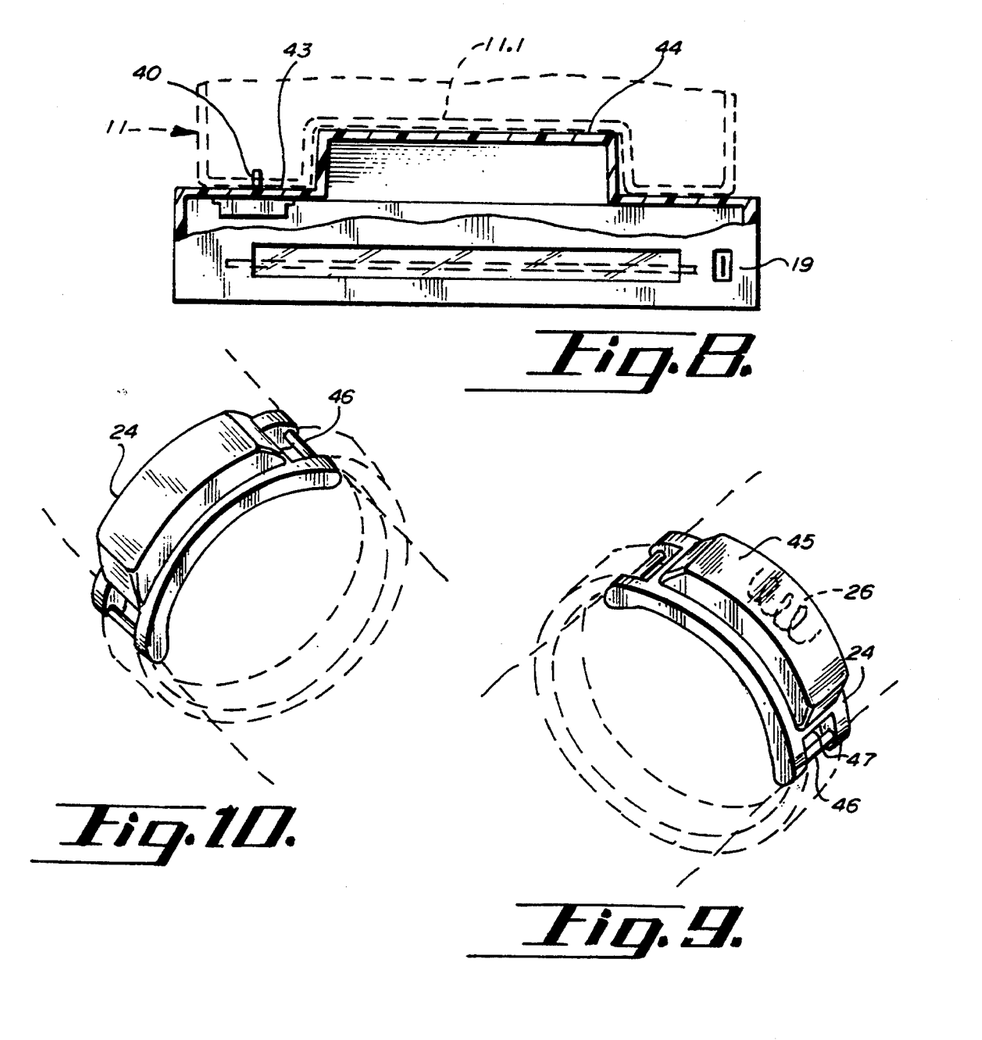
FIG. 8 is a detail section view of a portion of a box nest and a portion of a box resting thereon.
FIG. 9 is a left side perspective view of a wrist tag incorporating a transponder.
FIG. 10 is a right side perspective view of the wrist tag incorporating a transponder.

FIGS. 6, 7 and 8 illustrate the detailed shape of the nest 19 for the container 11. The upper portion 43 of the housing of nest 19 has protruding insert portions 44 which fit into and are received into the bottom wall portion 11.1 of the box when the box is rested upon the nest 19. As previously indicated, the feeler 40 of the proximity sensor protrudes through the upper portion 43 of the nest 19 as to be engaged by a portion of the container when the container rests upon the nest.

The ornamental design of the nest 19 is well shown from various sides in FIGS. 6 and 7.

The specific design of the tag 24, attachable to a person's wrist, is illustrated in FIGS. 9 and 10 from different sides. The central portion 45 of the tag carries the transponder 26 which is shown schematically in dotted lines in FIG. 9. The end portions 46 of the tag 24 have openings 47 to facilitate attaching the wristband or strap 28 thereto.

Referring again to FIGS. 1 and 11-13, the host computer 17 regularly polls all of the identifying stations 15, 16 to determine from these stations whether an instrumentality has been identified and to determine whether an instrumentality is present at one of the identifying stations to be identified. The identifying stations are polled in sequence for responses.

Figure 13:
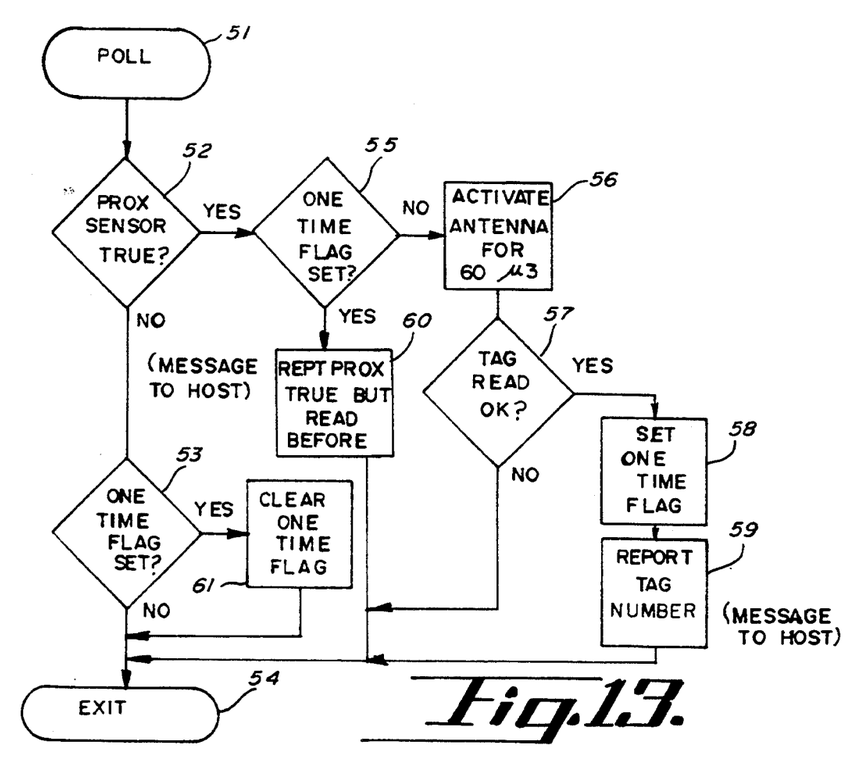
FIG. 13 is a flow diagram indicating the identifying functions being performed.

As illustrated in FIG. 13, in polling, see box 51, the host computer 17 and the r.f. sensor 32 of a particular identifying station 15, 16 senses the condition of the proximity sensor to determine whether the proximity sensor 32, see box 52, indicates a true condition, i.e., the presence of an instrumentality. If the proximity sensor responds "no" or "not true", i.e., the absence of any instrumentality at the identifying station, an additional inquiry is made as to whether a one-time flag has been set, see box 53, and if the response to that is in the negative, the host computer simply passes the identifying station, exits, see box 54, and goes on to the next station.

In the event one of the stations has an instrumentality which is present, the r.f. sensor 32 will determine that the proximity sensor reports "true", i.e., the presence of an instrumentality, and will then determine whether a one-time flag has yet been set, see box 55, and if the one-time flag has not yet been set, the r.f. sensor will activate the antenna 33 of the identifying station, see box 56, causing generation of an r.f. transmitted inquiry of the adjacent tag 24 or 25. When the r.f. transmitted inquiry has been received by the tag on the instrumentality, the transponder in the tag (24 or 25) will generate an r.f. identifying signal momentarily, which is received by the antenna and the r.f. sensor 32. The r.f. sensor 32 will determine whether the identification of the instrumentality 24 or 25 has been accurately read, see box 57; and if the response is "yes", the tag has been satisfactorily read, then the r.f. sensor will set a one-time flag, see box 58, and will report the tag number, see box 59, to the host computer. In the event that the tag was not accurately read, and responds "no", then the one-time flag is not set, and the inquiry from the host computer is terminated, see box 54, subject to polling of the identifying station in the next polling sequence by the host computer.

After the tag of the instrumentality has been properly read and reported by message to the host computer, a one-time flag of this action will have been set in the r.f. sensor. When the station is next polled by the host computer, and the proximity sensor reports "yes" or "true", see box 52, the r.f. sensor 32 will again inquire as to whether the one-time flag has been set, see box 55, and because the one-time flag has been set, the response to the inquiry is "yes", and whereupon the r.f. sensor 32 will report to the host computer that the proximity sensor reports "true", but the tag has been read before, see box 60, so that no additional message need be sent to the host computer. Accordingly, the r.f. signal will not be generated and transmitted at the antenna, and the transponder of the tag on the instrumentality will not respond.

Subsequently, when a change of condition is encountered at the nest, i.e., the person's arm is removed from the nest 20, or the box 11 is removed from the nest 19, the proximity sensor will again report "no", see box 52, i.e., the absence of an instrumentality; and subsequently the r.f. sensor 32 will inquire as to whether the one-time flag has been set, see box 53 and if the report is "yes", the one-time flag will be cleared, see box 61, so that a report to the host computer will simply be that there is no instrumentality at the identifying station to be identified.

In the event that the instrumentality had been sensed at the proximity sensor and after a short delay, the instrumentality is momentarily removed from the identifying station, but then returned to the station, the proximity sensor will continue to report "true", i.e., "yes", indicating the presence of the instrumentality, whereupon the r.f. sensor will again report to the host computer that the proximity sensor reports "true", but the identity of the tag has been read before.

Where the presence of box 11 has been detected at one of the identifying stations 15, the host computer may transmit a message to the r.f. sensor of the appropriate identifying station which is to be displayed at the LCD display in the window 41.

It will be recognized that when an instrumentality is detected at one of the identifying stations, see box 52, the r.f. transmitted inquiry from the r.f. sensor will be transmitted only momentarily, i.e., for approximately 60 microseconds, see box 56, as to minimize the exposure of nearby persons and media to this r.f. transmission; and then the transponder of the identifying tag will also only transmit only momentarily, obtaining the same advantage of minimal transmission. When the identity of the unique signal from the transponder in the tag has been identified and therefore the instrumentality has been identified, no additional r.f. transmissions will be emanated from either the antenna of the identifying station or from the transponder on the instrumentality.

It will be recognized that the present disclosure is of a method of identifying an instrumentality, i.e., a person or an object such as a container filled with semiconductor wafers; attaching a programmed transponder to the instrumentality to be identified, and wherein the transponder is preprogrammed for transmitting a unique r.f. identifying signal, sensing the proximity or absence of the instrumentality at the identifying station, momentarily generating an r.f. transmitted identification inquiry from the identifying station when permitted by the sensed proximity of the instrumentality and inducing the transponder to transmit the identifying signal. The generating of the identification inquiry is prevented by the sensed absence of the instrumentality, receiving the unique identifying signal to identify the instrumentality, and preventing subsequent generation of an r.f. transmitted identification inquiry until after the absence of the instrumentality is sensed.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A device for identifying a particular instrumentality at a particular location, comprising
    a tag portion attachable to such an instrumentality and comprising a transponder portion generating and transmitting a radio frequency identification signal in response to receipt of a radio frequency transmitted inquiry,
    an instrumentality identifying station,
    a proximity sensor portion sensing the presence and absence of the instrumentality adjacent the instrumentality identifying station and respectively producing sensor indications of the presence and the absence of the instrumentality,
    said instrumentality identifying station comprising an antenna portion and a radio frequency sensor portion generating the radio frequency transmitted inquiry through the antenna portion in response to the proximity sensor portion producing sensor indications of the presence of the instrumentality and receiving the radio frequency identification signal through the antenna portion from the transponder portion and producing an output indication representing the transponder identification signal, the radio frequency sensor portion terminating generation of the radio frequency transmitted inquiry when a clear and reliable output indication identifying the tag portion has been produced, and the radio frequency sensor portion also preventing, after producing said clear and reliable output indication, generation of a subsequent radio frequency transmitted inquiry until the proximity sensor portion has subsequently produced sensor indications of the absence of the instrumentality and has thereafter again produced sensor indications of the presence of the instrumentality, and
    a control means regularly polling said instrumentality identification station and inducing said proximity sensor portion to sense the presence or absence of the instrumentality adjacent the instrumentality identification station.

2. A device according to claim 1 wherein the proximity sensor portion comprises a photodiode portion responsive to the presence of the instrumentality for interfering with light received by the photodiode.

3. A device according to claim 2 wherein the photodiode portion responds to ambient light varied by presence of the instrumentality.

4. A device according to claim 1 wherein said radio frequency sensor portion continues, during a time delay after producing said clear and reliable output indication and after the proximity sensing portion has subsequently indicated the absence of the instrumentality, to prevent generation of a radio frequency transmitted inquiry, to allow the instrumentality to be momentarily removed from and returned to the instrumentality identifying station.

5. A device according to claim 1 wherein said tag portion comprises a wrist band attachable onto a person's wrist.

* * * * *